United States Patent [19]
Lin et al.

[11] Patent Number: 6,066,974
[45] Date of Patent: May 23, 2000

[54] HIGH POWER TRANSISTOR SWITCH WITH LOW TRANSMISSION LOSS

[75] Inventors: Chao-Hui Lin, Hsinchu; Chien-Kuang Lee, Taipei Hsien, both of Taiwan

[73] Assignee: Industrial Technology Research Institute, Hsinchu, Taiwan

[21] Appl. No.: 09/223,644

[22] Filed: Dec. 30, 1998

[30] Foreign Application Priority Data

Jul. 2, 1998 [TW] Taiwan ................... 87110861

[51] Int. Cl.[7] ...................................... H03L 5/00

[52] U.S. Cl. .......................... 327/320; 327/382

[58] Field of Search .................. 326/113; 327/309, 327/310, 312, 313, 314, 315, 316, 320, 324, 325, 327, 328, 333, 365, 382, 419, 425, 427, 493, 504, 583; 333/100, 101, 103, 104

[56] References Cited

U.S. PATENT DOCUMENTS 5,774,792 6/1998 Tanaka et al. ........................... 485/78
5,777,530 7/1998 Nakatuka ................................. 333/104

*Primary Examiner*—Timothy P. Callahan
*Assistant Examiner*—Jeffrey Zweizig
*Attorney, Agent, or Firm*—Koda & Androlia

[57] ABSTRACT

A transistor switch comprises a first field-effect transistor, a second field-effect transistor, a clamping circuit and a coupling circuit. The first field-effect transistor is controlled by a first voltage source to be turned on during a transmission mode. The second field-effect transistor, which is controlled by a second voltage source to be turned off during the transmission mode, has one current carrying terminal connected to the first field-effect transistor. The clamping circuit is connected between a gate of the second field-effect transistor and the second voltage source. The coupling circuit is connected between the gate and one current carrying terminal of the second field-effect transistor.

9 Claims, 3 Drawing Sheets

HIGH POWER TRANSISTOR SWITCH WITH LOW TRANSMISSION LOSS

BACKGROUND OF THE INVENTION

1. Field of the Invention

The present invention relates to transistor switches. More particularly, the present invention relates to a high power transistor switch with low transmission loss.

2. Description of the Related Art

For acquiring superior operation performance, field-effect transistors, hereinafter FETs, have been widely utilized to realize conventional single-pole double-throw switches. Referring to FIG. 1, a conventional single-pole double-throw switch realized by field-effect transistors is schematically illustrated. The conventional switch is constituted by a pair of FETs $T_1$ and $T_2$. In FIG. 1, reference numeral 16 designates an antenna whereas Rx represents a receiving terminal through which received signals are sent to a demodulator (not shown in the drawing) for further processing, and Tx represents a transmitting terminal through which signals to be transmitted from a modulator (not shown in the drawing) are sent to the antenna 16.

As shown in FIG. 1, both the FETs $T_1$ and $T_2$ are configured with sources connected with a bias circuit 10, wherein a capacitor $C_1$ is provided between the source of the FET $T_1$ connected to the bias circuit 10 and the transmitting terminal Tx, and another capacitor $C_2$ is provided between the source of the FET $T_2$ connected to the bias circuit 10 and the receiving terminal Rx. Moreover, the drains of the FETs $T_1$ and $T_2$ are both coupled to the antenna 16 by a capacitor $C_3$. The capacitors $C_1$, $C_2$ and $C_3$ are all DC blocking capacitors. In addition, the FET $T_1$ has its gate connected to a first voltage source 12 through a resistor $R_1$, whereas the FET $T_2$ has its gate connected to a second voltage source 14 through a resistor $R_2$.

In transmission mode, since the FET $T_1$ is turned on and the FET $T_2$ is turned off, signals to be transmitted go from the transmitting terminal Tx through the FET $T_1$ to the antenna 16. In reception mode, on the other hand, signals received from the antenna 16 pass through the FET $T_2$ to the receiving terminal Rx while the FET $T_1$ is turned off and the FET $T_2$ is turned on.

However, the FET $T_2$ in the reception path may be erroneously turned on and result in a great deal of transmission loss when the conventional transistor switch is operated during high power transmission. Referring to FIG. 2, a drawing for explaining transmission loss occurring to the conventional transistor switch because the FET $T_2$ is erroneously turned on is schematically illustrated. As mentioned above, the FET $T_2$ should be turned off while the FET $T_1$ is turned on in the transmission mode. The FET $T_1$ and $T_2$ are preferably fabricated onto compound semiconductor material and provided with a threshold voltage of about $-0.6V$; that is, the FET device is turned on when $V_{gs} > -0.6V$ and turned off when $V_{gs} < -0.6V$. As an example, in the transmission mode, the first voltage source 12 and the second voltage source 14 supply 3V and 0V, respectively, whereas the bias circuit 10 provides 3V to the FET $T_2$. Accordingly, the signals to be transmitted pass through the FET $T_1$ and the capacitor $C_3$ to the antenna 16.

For example, the voltage at the node $V_D$ ranges $3V \pm 6V$ under high power transmission. There are two junction capacitors $C_{gd}$ and $C_{gs}$ (the capacitance of $C_{gd}$ and $C_{gs}$ are usually less than 1 pF) between the gate-drain and gate-source of the FET $T_2$, respectively. Assuming that the capacitors $C_{gd}$ and $C_{gs}$ are of substantially equal capacitance, the gate voltage $V_G$ of the FET $T_2$ ranges within $0V \pm 3V$ along with the $V_D$ variation because of the coupling effect.

When $V_D$ attains the maximum voltage, for example, 9V (3V+6V), the gate voltage $V_G$ of the FET $T_2$ is about 3V (0V+3V). Thereby, the highest value for the voltage difference between $V_G$ and $V_S$ is 0V, which is higher than the threshold voltage of the FET $T_2$ (e.g., $-0.6V$), and therefore, the FET $T_2$ is erroneously turned on in transmission mode. Alternatively, when $V_D$ attains the minimum voltage, for example, $-3V$ (3V-6V), the gate voltage $V_G$ of the FET $T_2$ is about $-3V$ (0-3V). Thereby, the highest value for the voltage difference between $V_G$ and $V_D$ is 0V, which is higher than the threshold voltage of the FET $T_2$ (e.g., $-0.6V$), and, therefore, the FET is erroneously turned $T_2$ on in transmission mode. Accordingly, the FET $T_2$ may be erroneously turned on during either the positive cycle or the negative cycle so as to cause loss to the transmission power along the reception path.

For reducing the coupling effect, two FETs connected in series instead of the FET $T_2$ may be a feasible approach. However, the series-connected FETs will increase loss along the reception path under reception mode and deteriorate reception sensitivity. Moreover, more FETs are required to implement the transistor switch.

SUMMARY OF THE INVENTION

Therefore, it is an object of the present invention to provide a transistor switch for keeping the FET in the reception path turned off during high power transmission and eliminating transmission loss along the reception path.

It is another object of the present invention to provide a transistor switch that does not increase reception loss along the reception path under the reception mode.

For achieving the aforementioned objects, the present invention provides a transistor switch comprising a first field-effect transistor, a second field-effect transistor, a clamping circuit and a coupling circuit. The first field-effect transistor is controlled by a first voltage source to be turned on during a transmission mode. The second field-effect transistor, which is controlled by a second voltage source to be turned off during the transmission mode, has one current carrying terminal connected to the first field-effect transistor. The clamping circuit is connected between a gate of the second field-effect transistor and the second voltage source. The coupling circuit is connected between the gate and one current carrying terminal of the second field-effect transistor.

BRIEF DESCRIPTION OF DRAWINGS

The following detailed description, given by way of examples and not intended to limit the invention to the embodiments described herein, will best be understood in conjunction with the accompanying drawings, in which:

FIG. 2 illustrates a drawing explaining transmission loss occurring to the conventional transistor switch of FIG. 1 because the FET is erroneously turned on;

DETAILED DESCRIPTION OF THE INVENTION

According to the transistor switch of the present invention, a clamping circuit and a coupling circuit are coupled to the FET in the reception path to ensure that it is turned off during high power transmission.

Figure 1:
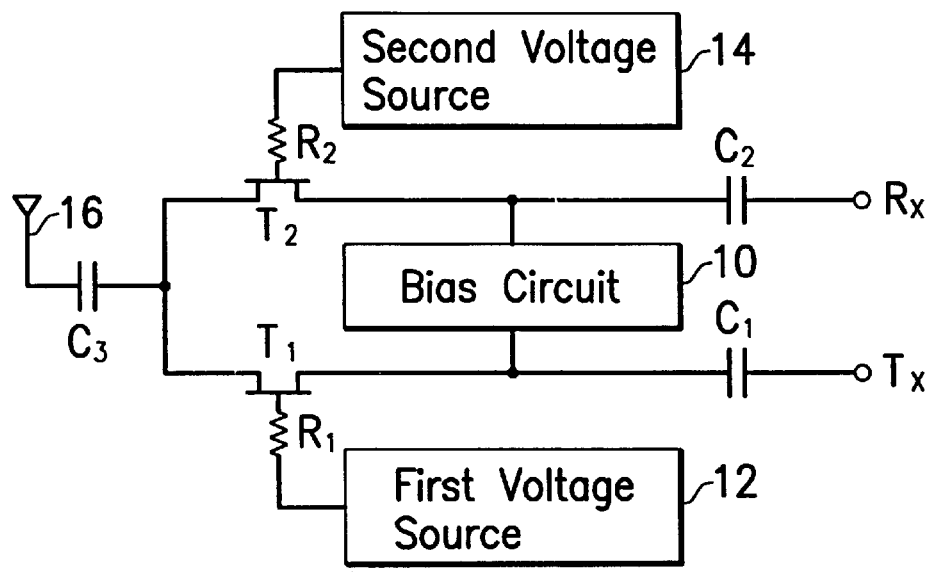
FIG. 1 schematically depicts a conventional single-pole double-throw switch realized by field-effect transistors.
Figure 2:
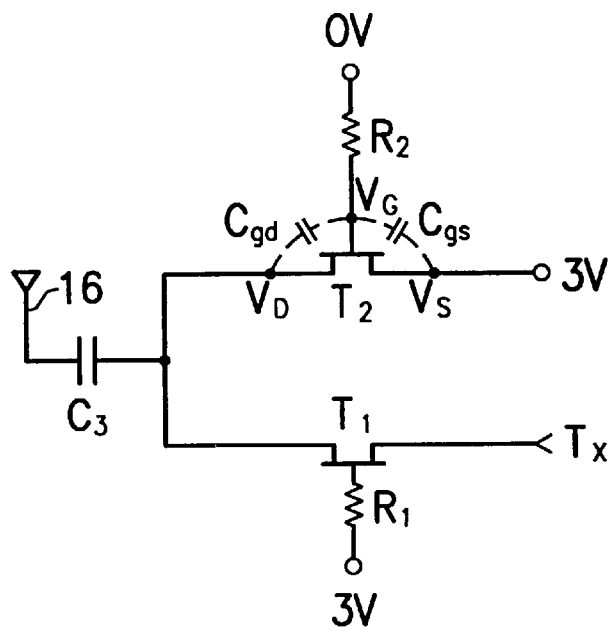
Figure 3:
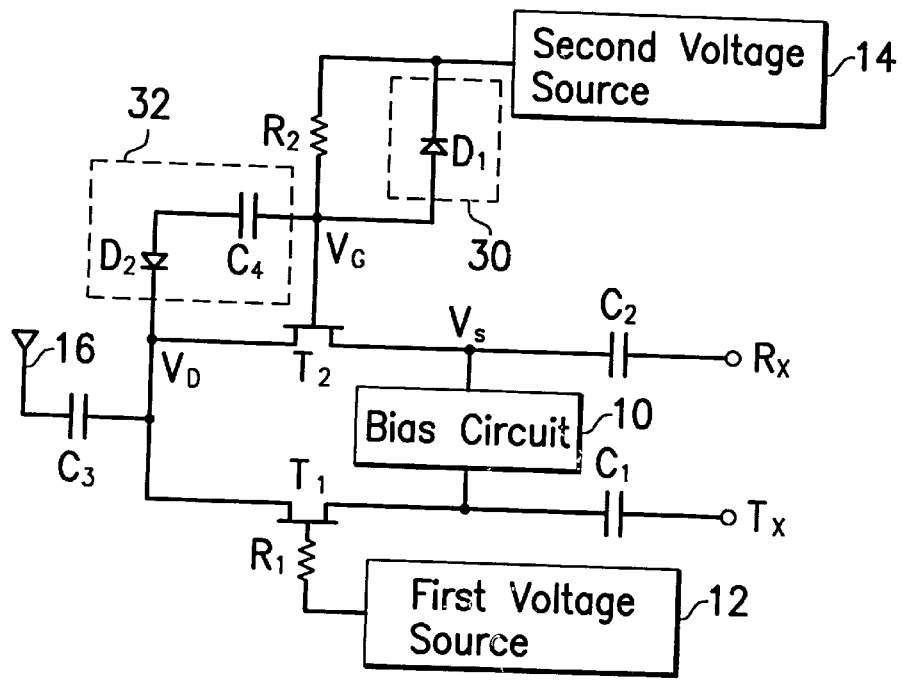
FIG. 3 schematically depicts a circuit diagram of one preferred embodiment in accordance with the present invention.

Referring to FIG. 3, a circuit diagram of one preferred embodiment in accordance with the present invention is schematically illustrated, wherein a pair of FETS T1 and T2 constitute a transistor switch. In FIG. 3, reference numeral 16 designates an antenna, whereas Rx represents a receiving terminal through which received signals are sent to a demodulator (not shown in the drawing) for further processing, and Tx represents a transmitting terminal through which signals to be transmitted from a modulator (not shown in the drawing) are sent to the antenna 16.

As shown in FIG. 3, both the FETs $T_1$ and $T_2$ are configured with sources connected with a bias circuit 10, wherein a capacitor $C_1$ is provided between the source of the FET $T_1$ connected to the bias circuit 10 and the transmitting terminal Tx, and a capacitor $C_2$ is provided between the source of the FET $T_2$ connected to the bias circuit 10 and the receiving terminal Rx. Moreover, the drains of the FETs $T_1$ and $T_2$ are both coupled to the antenna 16 by a capacitor $C_3$. The capacitors $C_1$, $C_2$ and $C_3$ are all DC blocking capacitors. In addition, the FET $T_1$ has its gate connected to a first voltage source 12 through a resistor $R_1$, where the FET $T_2$ has its gate connected to a second voltage source 14 through a resistor $R_2$.

Further referring to FIG. 3, a clamping circuit 30 and a coupling circuit 32 are connected to the FET $T_2$ in the reception path. The clamping circuit 30 is connected in parralel with the resistor $R_2$ (that is, between the gate of the FET $T_2$ and the second voltage source 14) whereas the coupling circuit 32 is connected between the gate and the drain of the FET $T_2$. The clamping circuit 30 is used to ensure the voltage difference between $V_G$ and $V_S$ is less than the threshold voltage of the FET $T_2$, whereas the coupling circuit 32 is employed to ensure the voltage difference between $V_G$ and $V_D$ is less than the threshold voltage of the FET $T_2$ in transmission mode, especially in high power transmission.

According to one preferred embodiment of the present invention, the clamping circuit 30 is implemented by a diode $D_1$ configured with its anode connected to the gate of the FET $T_2$ and its cathode connected to the second voltage source 14. Furthermore, the coupling circuit 32 can be implemented by a capacitor $C_4$ and a diode $D_2$ connected in series. For example, the capacitor $C_4$ can be connected between the gate of the FET $T_2$ and the anode of the diode $D_2$ whose cathode is tied to the drain of the FET $T_2$ coupled to the antenna 16. Alternatively, the capacitor $C_4$ can be connected between the drain of the FET $T_2$ coupled to the antenna 16 and the cathode of the diode $D_2$ whose anode is tied to the gate of the FET $T_2$.

Figure 4:
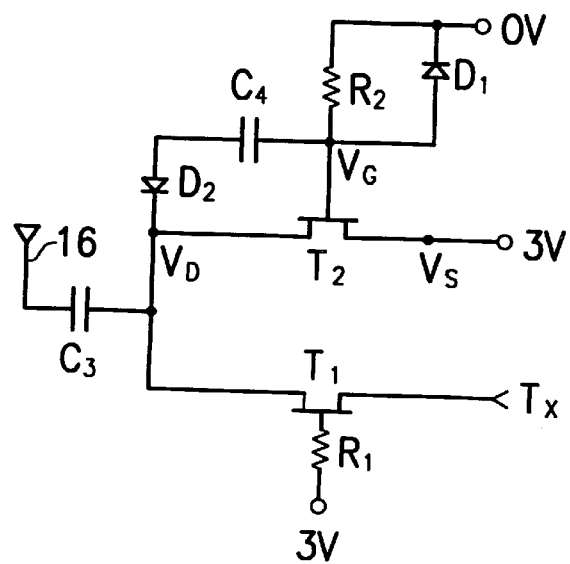
FIG. 4 illustrates an explanatory drawing of the circuit of FIG. 3 operates at high power transmission.

For clarity, the clamping circuit 30 realized by the diode $D_1$, the coupling circuit 32 realized by the capacitor $C_4$ and the diode $D_2$ connected in series are exemplified. Referring to FIG. 4, an explanatory drawing of the circuit of FIG. 3 operating at high power transmission is schematically illustrated. As mentioned above, the FET $T_2$ should be turned off while the FET $T_1$ is turned on in the transmission mode. The FET $T_1$ and $T_2$ are preferably fabricated onto a compound semiconductor material such as GaAs and provided with a threshold voltage of about −0.6V; that is, the FET device is turned on when $V_{gs}$>−0.6V and, otherwise, turned off when $V_{gs}$<−0.6V. As an example, in the transmission mode, the first voltage source 12 and the second voltage source 14 supply 3V and 0V, respectively, whereas the bias circuit 10 provides 3V to the FET $T_2$. Accordingly, the signals to be transmitted pass through the FET $T_1$ and the capacitor $C_3$ to the antenna 16.

Since the present invention is employed to resolve the transmission loss during the high power transmission, the voltage at the node VD ranging 3V±6V is exemplified.

When $V_D$ ranges from 3V to 9V, the diode $D_2$ is reverse biased. Since two junction capacitors $C_{gd}$ and $C_{gs}$ are provided between the gate-drain and gate-source of the FET $T_2$, respectively, the gate voltage $V_G$ of the FET $T_2$ ranges from 0V to 3V along with the $V_D$ variation because of the coupling effect. However, if the gate voltage $V_G$ exceeds 0.7V, which is the the cut-in voltage of diode $D_1$, the gate voltage $V_G$ is clamped to about 0.7V and results in the voltage difference between $V_G$ and $V_S$ of about −2.3V, which is much lower than the threshold voltage of the FET $T_2$, thereby assuring the FET $T_2$ to be turned off.

Alternatively, when $V_D$ ranges from 3V to −3V, the diode $D_2$ is forward biased, and thus the capacitor $C_4$ is coupled between the gate of the FET $T_2$ and the drain of the FET $T_2$ coupled to the antenna 16. Meanwhile, although the junction capacitors $C_{gd}$ and $C_{gs}$ are provided between the gate-drain and gate-source of the FET $T_2$, the gate voltage $V_G$ ranges from about 0V to about −6V because the capacitor $C_4$ has a capacitance greater than that of the junction capacitors $C_{gd}$ and $C_{gs}$. Therefore, when $V_D$ attains the minimum voltage of −3V (3V−6V) while the gate voltage $V_G$ is about −6V (0V−6V), the voltage difference between $V_G$ and $V_D$ is about −3V, which is much less than the threshold voltage (e.g. −0.6V) of the FET $T_2$. Thus, the FET $T_2$ is assured to turn off.

Figure 5:
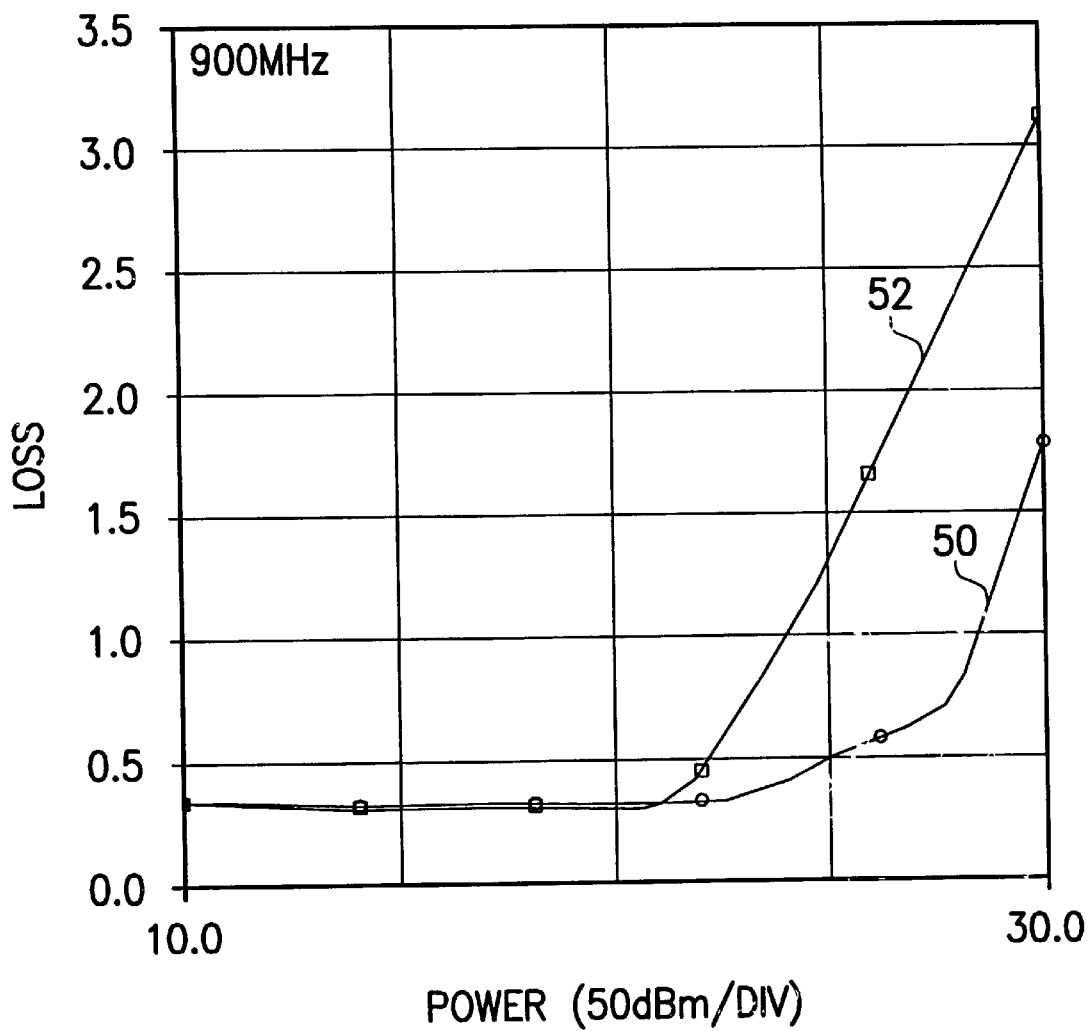
FIG. 5 is a diagram illustrating transmission power versus loss of the transistor switch according to the present invention shown together with that of the conventional transistor switch is shown together for comparison.

Refer to FIG. 5, a diagram illustrating transmission power versus loss of the transistor switch according to the present invention at 900 MHz, with that of the conventional switch also shown for comparison. In FIG. 5, a curve 50 designates the transistor switch in accordance with the preferred embodiment of FIG. 3 with the capacitor $C_4$ of 5 pF, and another curve 52 designates the conventional transistor switch for comparison. In connection with the 1 dB compression point, the transistor switch of the present invention increases 4 dBm as compared to the conventional one.

In conclusion, the transistor switch according to the present invention provides the clamping circuit and the coupling circuit connected to the FET in the reception path so that the FET in the reception path can be ensured to turn off during high power transmission. Accordingly, the transistor switch of the present invention with reduced transmission loss is suited in the application of high power transmission.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A switch, comprising:

a first field-effect transistor controlled by a first voltage souce to be turned on during a transmission mode;

a second field-effect transistor provided with one current carrying terminal connected to said first field-effect transistor and controlled by a second voltage source to be turned off during said transmission mode;

a clamping circuit connected between a gate of said second field-effect transistor and said second voltage source; and a coupling circuit connected between said gate and said one current carrying terminal of said second field-effect transistor.

2. The switch as claimed in claim 1, wherein said clamping circuit comprises a diode having its anode and cathode connected to said gate of said second field-effect transistor and said second voltage source.

3. The switch as claimed in claim 1, wherein said coupling circuit comprises a capacitor and a diode connected in series.

4. The switch as claimed in claim 1, wherein said first voltage source is connected to a gate of said first field-effect transistor by a resistor.

5. The switch as claimed in claim 1, wherein said second voltage source is connected to said gate of said second field-effect transistor by a resistor.

6. A switch, comprising:

a first field-effect transistor controlled by a first voltage source to be turned on during a transmission mode;

a second field-effect transistor provided with one current carrying terminal connected to said first field-effect transistor and controlled by a second voltage source to be turned off during said transmission mode;

a first diode having its anode and cathode connected to a gate of said second field-effect transistor and said second voltage source, respectively; and a capacitor connected between said gate and said one current carrying terminal of said second field-effect transistor.

7. The switch as claimed in claim 6, further comprising a second diode connected in series with said capacitor between said gate and said one current carrying terminal of said second field-effect transistor.

8. The switch as claimed in claim 6, wherein said first voltage source is connected to a gate of said first field-effect transistor by a resistor.

9. The switch as claimed in claim 6, wherein said second voltage source is connected to said gate of said second field-effect transistor by a resistor.

* * * * *